US008765498B2

(12) United States Patent
Kato

(10) Patent No.: US 8,765,498 B2
(45) Date of Patent: Jul. 1, 2014

(54) METHOD OF MANUFACTURING LIQUID DISCHARGE HEAD SUBSTRATE, METHOD OF MANUFACTURING LIQUID DISCHARGE HEAD, AND METHOD OF MANUFACTURING LIQUID DISCHARGE HEAD ASSEMBLY

(75) Inventor: Masataka Kato, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 4 days.

(21) Appl. No.: 13/106,593

(22) Filed: May 12, 2011

(65) Prior Publication Data

US 2011/0287562 A1 Nov. 24, 2011

(30) Foreign Application Priority Data

May 19, 2010 (JP) ................................ 2010-115350

(51) Int. Cl.
*H01L 21/00* (2006.01)

(52) U.S. Cl.
USPC .................................... 438/21; 257/E21.001

(58) Field of Classification Search
USPC .................................... 257/E21.001; 438/21
See application file for complete search history.

(56) References Cited

U.S. PATENT DOCUMENTS

| | | | | |
|---|---|---|---|---|
| 5,358,824 | A * | 10/1994 | Tan et al. | 430/192 |
| 6,331,259 | B1 * | 12/2001 | Ozaki et al. | 216/27 |
| 6,569,343 | B1 * | 5/2003 | Suzuki et al. | 216/27 |
| 6,702,413 | B2 * | 3/2004 | Takabayashi et al. | 347/8 |
| 7,475,966 | B2 * | 1/2009 | Fujii et al. | 347/65 |
| 7,530,670 | B2 * | 5/2009 | Matsushita et al. | 347/54 |
| 7,560,224 | B2 * | 7/2009 | Sato et al. | 430/320 |
| 2003/0048328 | A1 * | 3/2003 | Inamoto et al. | 347/44 |

FOREIGN PATENT DOCUMENTS

| | | |
|---|---|---|
| JP | 2003-053979 A | 2/2003 |
| JP | 2009-137155 A | 6/2009 |

* cited by examiner

*Primary Examiner* — Lex Malsawma
*Assistant Examiner* — Sheng Zhu
(74) *Attorney, Agent, or Firm* — Canon USA Inc. IP Division

(57) ABSTRACT

A method of manufacturing a liquid discharge head substrate, includes forming an etching mask layer having an opening in a shape corresponding to a plurality of second portions on a second plane of the substrate, forming a recess to be a first portion by etching the substrate through the opening of the etching mask layer from a second plane side of the substrate, and forming the plurality of second portions by etching a portion from a bottom of a first portion to a first plane using the etching mask layer as a mask from the second plane side of the substrate to form a liquid supply port passing through the substrate.

15 Claims, 10 Drawing Sheets

METHOD OF MANUFACTURING LIQUID DISCHARGE HEAD SUBSTRATE, METHOD OF MANUFACTURING LIQUID DISCHARGE HEAD, AND METHOD OF MANUFACTURING LIQUID DISCHARGE HEAD ASSEMBLY

BACKGROUND OF THE INVENTION

1. Field of the Invention

The present invention relates to a method of manufacturing a liquid discharge head substrate, a method of manufacturing a liquid discharge head that discharges a liquid from a liquid discharge port, and a method of manufacturing a liquid discharge head assembly, and preferably, relates to a method of manufacturing an ink jet recording head substrate, a method of manufacturing an ink jet recording head, and a method of manufacturing an ink jet recording head assembly.

2. Description of the Related Art

The following configuration is generally known as an ink jet recording head substrate having an ink supply port and an ink jet recording head containing a channel wall member having an ink channel and an ink discharge port. More specifically, an ink jet recording head in which the ink supply port includes a common ink supply port and an independent ink supply port communicatively connected to the common ink supply port and the ink channel, and the independent ink supply port is formed perpendicularly to a surface of the substrate on which the ink channel is formed. As a method of obtaining a high-definition high-quality image from such an ink jet recording head, the method discussed in Japanese Patent Application Laid-Open No. 2009-137155 and Japanese Patent Application Laid-Open No. 2003-053979 can be cited.

In an ink jet recording head discussed in Japanese Patent Application Laid-Open No. 2009-137155, a plurality of ink channels and a plurality of ink discharge ports are provided on a substrate including an ink discharge energy generation element. An ink channel is provided for one ink discharge port symmetrically communicatively connected thereto, each ink channel is communicatively connected to an independent ink supply port in a direction perpendicular to the ink channel, and the independent ink supply port is communicatively connected to one common ink supply port. The channel communicatively connected to the discharge port is symmetrically arranged and the channel and an independent ink supply port are communicatively connected perpendicularly and therefore, bubbles generated by an ink discharge pressure generation element grow equally on the right and left sides. Accordingly, the direction of ink droplets flying from an orifice surface can stably be kept perpendicular so that an ink jet recording head capable of achieving excellent print quality can be provided.

In addition, Japanese Patent Application Laid-Open No. 2009-137155 and Japanese Patent Application Laid-Open No. 2003-053979 discussed that an etching mask layer to form a common ink supply port is formed on the rear surface of a substrate and the common ink supply port is formed using the etching mask layer. Subsequently, the etching mask layer is once removed and then, a new etching mask layer is formed in the common ink supply port portion and an independent ink supply port is formed using the new etching mask layer.

Japanese Patent Application Laid-Open No. 2009-137155 and Japanese Patent Application Laid-Open No. 2003-053979 discussed that the common ink supply port and the independent ink supply port are formed using different etching mask layers. Thus, formation and peeling processes of the etching mask layer tend to increase and thus, decreasing the number of processes is demanded.

This applies not only to the ink jet recording head, but also other liquid discharge heads. Incidentally, the ink supply port, the common ink supply port, and the independent ink supply port in an ink jet recording head correspond to a liquid supply port and a first portion and a second portion of the liquid supply port in a liquid discharge head, respectively.

SUMMARY OF THE INVENTION

The present invention is directed to a method of manufacturing a liquid discharge head substrate by which manufacturing loads are suppressed with less formation and peeling processes of an etching mask layer, a method of manufacturing a liquid discharge head, and a method of manufacturing a liquid discharge head assembly are provided.

According to an aspect of the present invention, a method of manufacturing a liquid discharge head substrate to form a liquid supply port having a first portion that is a recess having an opening in a second plane and having a bottom between a first plane and the second plane and a plurality of second portions that are through-holes passing through from the bottom of the first portion to the first plane on a silicon substrate having the first plane and the second plane opposing each other, includes forming an etching mask layer having an opening in a shape corresponding to the plurality of second portions on the second plane of the substrate, forming a recess to be the first portion by etching the substrate through the opening of the etching mask layer from a second plane side of the substrate, and forming the plurality of second portions by etching a portion from the bottom of the first portion to the first plane using the etching mask layer as a mask from the second plane side of the substrate to form the liquid supply port passing through the substrate.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

The present invention relates to a method of manufacturing a liquid discharge head substrate forming a liquid supply port passing through the silicon substrate, a method of manufacturing a liquid discharge head, and a method of manufacturing a liquid discharge head assembly. In the description that follows, an ink jet recording head is taken as an application example of the present invention, but the range of application of the present invention is not limited to this. A manufacture method according to the present invention may also be applied to the production of a bio-chip and a liquid discharge head for electronic circuit printing. Liquid discharge heads include, in addition to the ink jet recording head, for example, a color filter manufacturing head.

Figure 5:
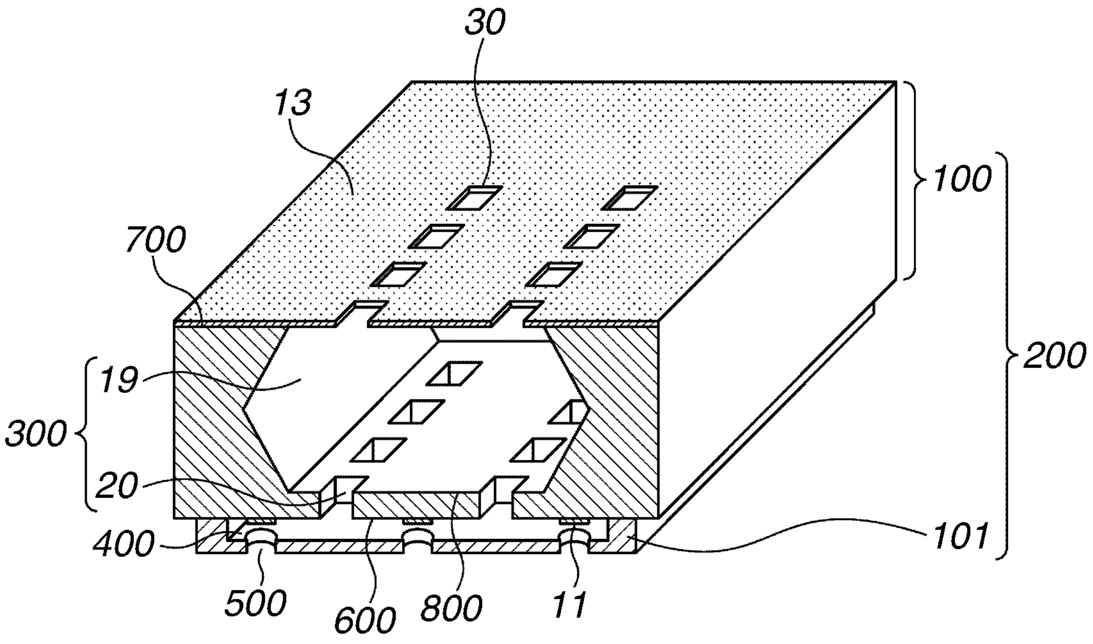
FIG. 5 is a perspective view illustrating a liquid discharge head manufactured according to an exemplary embodiment.

First, a liquid discharge head manufactured according to an exemplary embodiment of the present invention will be described. FIG. 5 is a schematic perspective view exemplifying a liquid discharge head manufactured according to an exemplary embodiment of the present invention. A liquid discharge head 200 includes a liquid discharge head substrate 100 and a channel wall member 101 including a liquid discharge port to discharge a liquid. The liquid discharge head substrate is formed by a silicon substrate and the silicon substrate has a first plane 600 and a second plane 700. The channel wall member 101 is provided on the first plane 600. The liquid discharge head substrate 100 can include a liquid discharge energy generation element 11 to generate energy for discharging a liquid to a surface and a liquid supply port 300, which is a through-hole passing through the substrate and supplies a liquid to the liquid discharge energy generation element 11. The liquid discharge head substrate may be in a state in which, as illustrated in FIG. 5, an etching mask layer 13 having openings 30 in a shape corresponding to the second portion of a liquid supply port described below is not removed and is left on the second plane or the etching mask layer may be removed after the liquid supply port being formed. If the liquid supply port of the liquid discharge head substrate has a plurality of second portions, the etching mask layer has the openings in a shape corresponding to the plurality of second portions formed therein. The channel wall member 101 includes a liquid discharge port 500 and a wall of a channel (i.e., a liquid channel 400) communicatively connecting the liquid supply port 300 and the liquid discharge port 500. A plurality of liquid discharge ports may be provided for one liquid channel and the channel wall member 101 can have a plurality of nozzle rows composed of one or more of the liquid discharge port 500 and the liquid channel 400 communicated therewith. The liquid supply port 300 contains a first portion 19 and a second portion 20. The first portion is a recess having an opening in the second plane and having a bottom 800 between the first plane and the second plane. The second portion is a through-hole passing through from the bottom 800 of the first portion 19 to the first plane 600. In FIG. 5, the liquid supply port 300 has the first portion 19, which is a common portion on the rear surface of the substrate (second plane) and a plurality of second portions 20 independently leading to the front surface of the substrate (first plane) after branching from the first portion.

The order of each process in the manufacture method of a liquid discharge head in the present invention can be interchanged when necessary within the scope in which effects of the present invention can be gained.

For example, an etching mask layer having the openings 30 in a shape corresponding to the second portion can be formed by patterning HIMAL (trade name, manufactured by Hitachi Chemical Co., Ltd.) to become a pattern of the independent supply port (second portion) later. An etching mask layer formed by forming a material other than HIMAL and an inorganic film of an oxide film or a nitride film by a chemical vapor deposition (CVD) apparatus and, after patterning the material by a photosensitive material, removing the inorganic film may be used as the etching mask layer.

From the viewpoint of accuracy of processing, the first portion of the liquid supply port can be formed by a method selected from a group consisting of laser processing technology, anisotropic etching, and dry etching or a method combining two or more methods from the group. More specifically, the combination of laser processing and crystal anisotropic etching of silicon can be performed. For this combination, laser processing can be performed first. In laser processing, the depth of a non-through hole from the second plane when a non-through hole 18 as illustrated in FIG. 1F is formed on the inner side of an etching mask pattern can be 100 μm or more and 600 μm or less, and more particularly 500 μm or more and 600 μm or less.

For example, an Si processing method using a gas cluster and an Si processing method using reactive ion etching can be cited as the formation method of the second portion of a liquid supply port. There are also other methods, but from the viewpoint of the processing tact, the selection ratio to the mask, and being less likely to be affected by irregularities of the second portion of the liquid supply port described later, a gas cluster can be used for the processing technology.

Though conditions for gas cluster etching may be set as appropriate, the following conditions can be set. More specifically, a mixed gas of chlorine trifluoride ($ClF_3$) and Ar can be used and the gas flow rate can be set to 50 sccm or more and 1000 sccm or less, and the gas pressure to 0.1 Pa or more and 50 Pa or less. The etching rate of silicon is about 40 μm/min and thus, the etching time can be 2 min or more and 10 min or less. The unit of flow rate sccm represents the flow rate (ml/min) at 0° C., 101.3 kPa.

The processing technology using a gas cluster will be described in detail below.

A gas cluster is an aggregate of several millions to several tens of millions of molecules. A gas cluster is formed by discharging a high-pressure reactive gas into a low-pressure vacuum chamber through a nozzle and the reactive gas is quickly cooled due to a pressure difference, so that the molecules get together to set. Silicon can easily be etched because the gas cluster can obtain high energy even if the gas cluster collides with a substrate at low speed. Thus, when a substrate is processed, only a simple process of blowing a gas cluster is needed.

Using a cutoff apparatus (collimator) between the nozzle of a gas cluster and an etching substance (silicon substrate), only a progressive gas cluster can selectively be used. Thus, even if the etching mask layer and the etching substance (silicon substrate) are separated, silicon can easily be etched.

Energy when a gas cluster collides with a silicon substrate is thermal energy converted from kinetic energy of the gas cluster. The thermal energy accelerates an etching reaction. Accordingly, high-speed silicon etching can be performed.

A resist mask, an inorganic film such as a silicon oxide film and a silicon nitride film, a metal film, a non-photosensitive resin material layer, and a photosensitive resin material layer can be used as an etching mask layer used in the present invention. Generally, when one of such etching mask layers is used, the selection ratio is about 2000. HIMAL (trade name, manufactured by Hitachi Chemical Co., Ltd.) may be used as a non-photosensitive resin material layer and a novolak base positive resist (for example, OFPR (trade name, manufactured by TOKYO OHKA KOGYO Co., Ltd.)) may be used as a photosensitive resin material layer. Al, Au, or Ta may be used as a metal film. A mixed gas of chlorine trifluoride ($ClF_3$) and Ar may be used as a gas used for a gas cluster. As described above, in general, the etching rate of silicon is about 40 μm/min.

When the second portion of the liquid supply port is passed through, a stop layer of gas cluster etching may be provided on the first plane side of the substrate and the stop layer can be Al, an oxide film, or a nitride film. The selection ratio when such layers are used is 2000 and thus, etching can easily be stopped. The stop layer present on the first plane of the substrate can be removed by a publicly known method and if the stop layer is made of Al, for example, a mixed solution of phosphoric acid, nitric acid, and acetic acid may be used to remove the stop layer.

As another independent ink supply port formation method, as described above, reactive ion etching can be cited. The reactive ion etching uses accelerated ions for etching and an apparatus therefore is divided into a plasma source to generate ions and a reaction chamber for etching. If, for example, an inductively coupled plasma (ICP) dry etching apparatus capable of emitting high-density ions is used as the ion source, a liquid supply port perpendicular to the substrate can be formed by alternating coating and etching (i.e., deposition/etching process). In the deposition/etching process, for example, sulfur hexafluoride ($SF_6$) gas may be used as an etching gas and, for example, perfluorocyclobutane ($C_4F_8$) gas may be used as a coating gas. In the present invention, a liquid supply port can be formed by dry etching using an ICP plasma apparatus, however, a dry etching apparatus having the plasma source of a different method may also be used. For example, an apparatus having an electron cyclotron resonance (ECR) ion source may be used.

Further, processing technology using reactive ion etching will be described. In the reactive ion etching, the mask used for etching is arranged apart from an etching substance (silicon substrate). Thus, if the reactive ion etching is used, etching can be performed under conditions of a high vacuum in which a mean free path is increased to enhance progressiveness of ions. If the mask and the etching substance are present apart from each other and etching is performed under conditions of a high vacuum to enhance progressiveness of ions, an influence of irregularities of the common ink supply port (first supply port portion) is less likely to be received even in a processing method using plasma. Thus, an independent ink supply port with enhanced perpendicularity can be formed. As a processing condition for reactive ion etching, the degree of vacuum can be 0.1 Pa or more and 50 Pa or less as a gas pressure. By controlling the degree of vacuum to this range, etching with enhanced perpendicularity can easily be performed. More specifically, as conditions for reactive ion etching, the flow rate of $SF_6$ gas can be set to 50 sccm or more and 1000 sccm or less, the flow rate of $C_4F_8$ gas to 50 sccm or more and 1000 sccm or less, and the gas pressure to 0.1 Pa or more and 50 Pa or less. Particularly, etching can be performed at a high vacuum between 0.5 Pa or more and 5 Pa or less. In the first exemplary embodiment described below, the second portion is formed by gas cluster etching, but if the reactive ion etching is used for processing, the reactive ion etching can be performed at the flow rate of $SF_6$ gas of 100 sccm, the flow rate of $C_4F_8$ gas of 100 sccm, and the gas pressure of 1 Pa.

When the second portion is formed by reactive ion etching, like when a gas cluster is used, a stop layer may be provided on the first plane of the substrate being passed through when the second portion is formed and an Al film, an oxide film, or a nitride film may be used as the stop layer. The selection ratio of these films is between 50 and 200 and thus, such films may be used as the stop layer for reactive ion etching. For the removal of the stop layer to be performed later, if the stop layer is made of, for example, Al, a mixed solution of phosphoric acid, nitric acid, and acetic acid may be used to remove the stop layer.

Figure 3A:
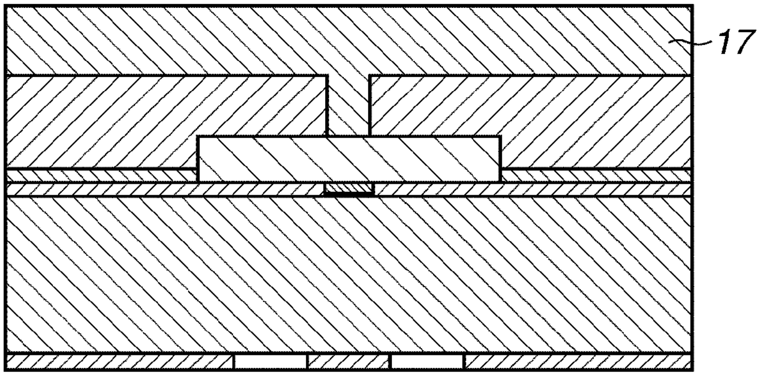
FIGS. 3A to 3F are schematic sectional views illustrating a third exemplary embodiment.
Figure 3B:
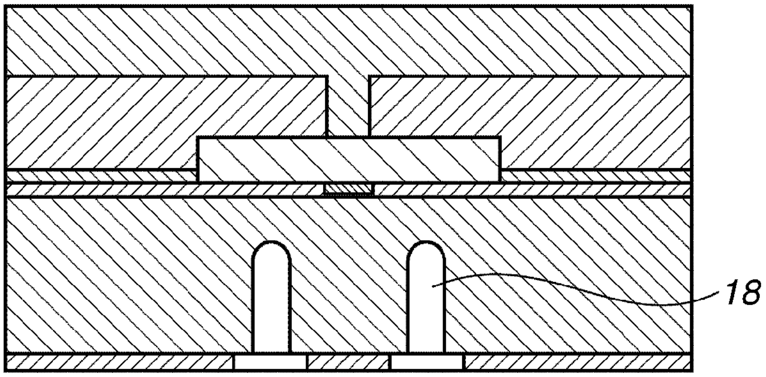
Figure 3C:
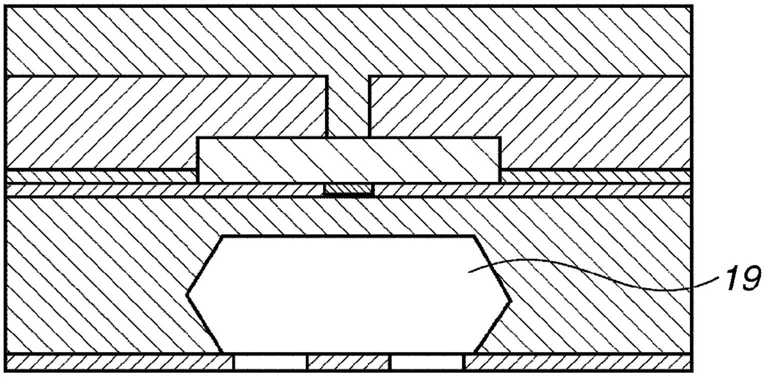
Figure 3D:
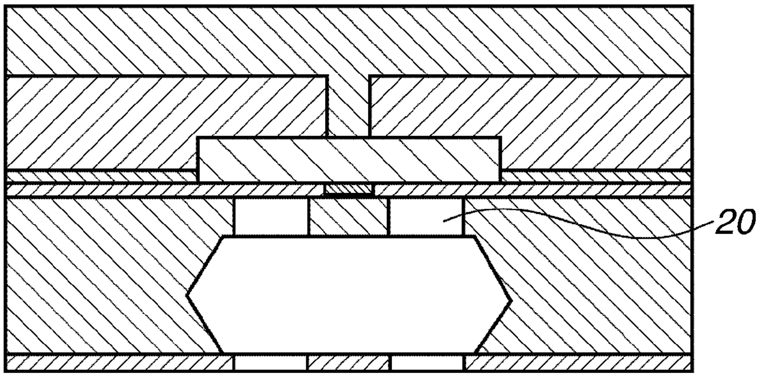
Figure 3E:
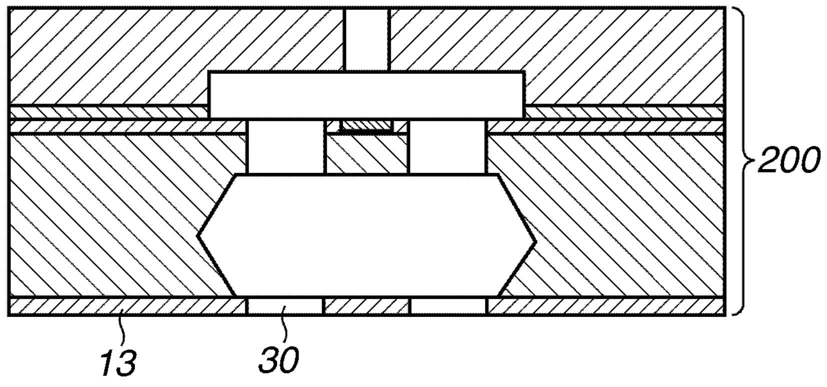
Figure 3F:
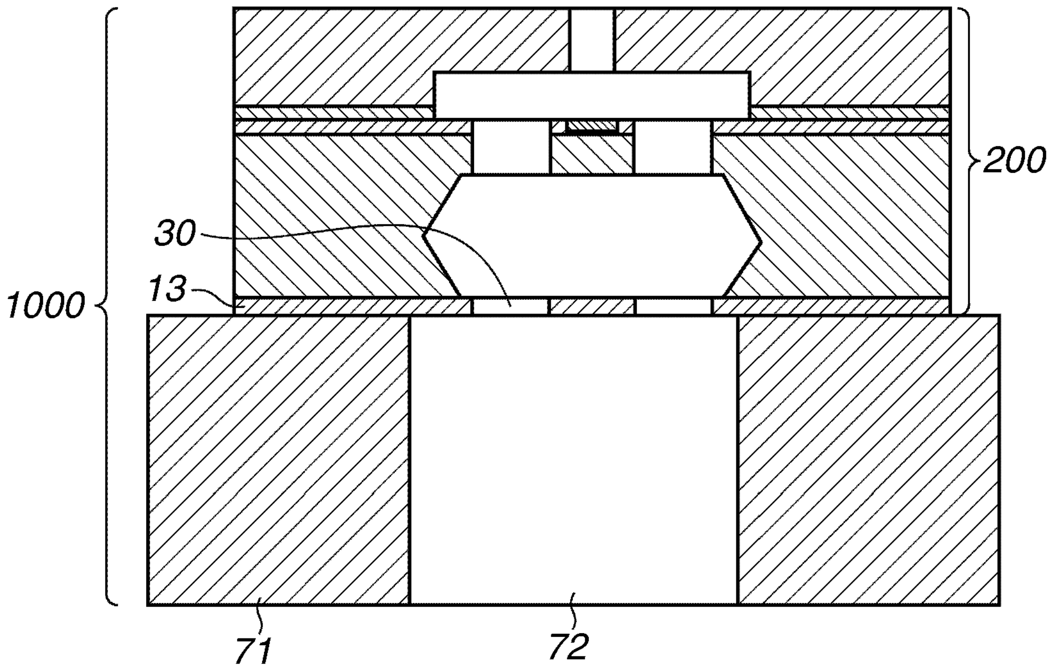
Figure 4A:
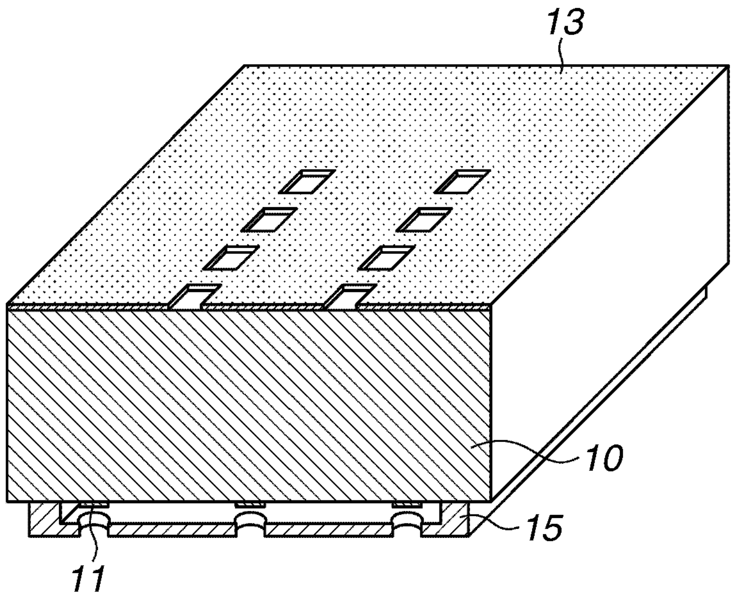
FIGS. 4A to 4E are perspective views illustrating the first exemplary embodiment.
Figure 4B:
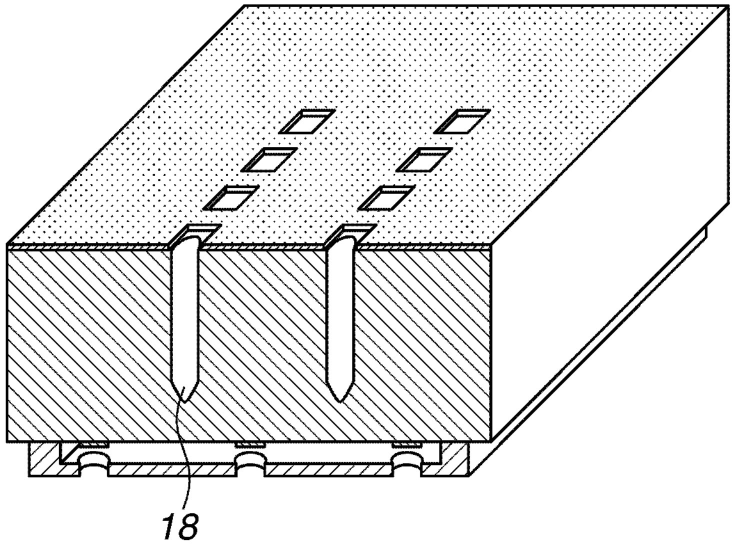
Figure 4C:
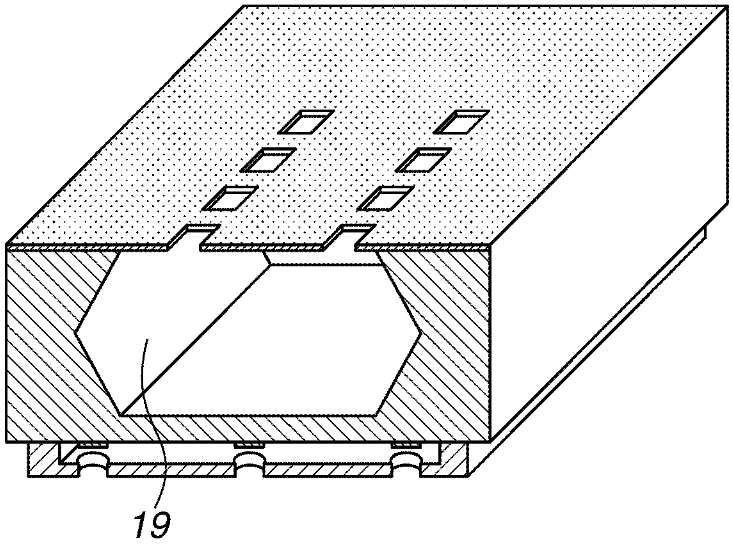
Figure 4D:
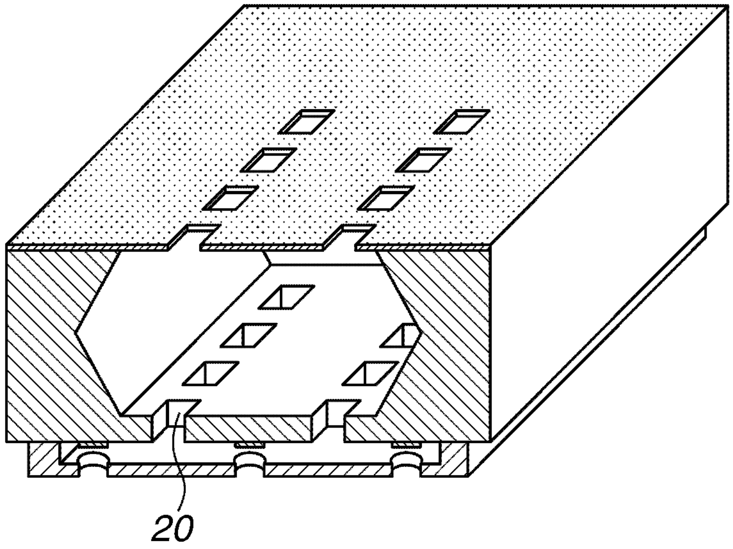
Figure 4E:
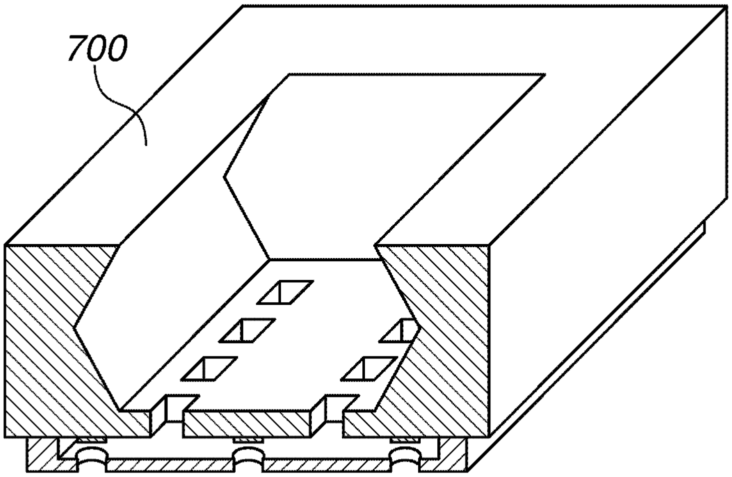

A liquid discharge head assembly 1000 including the liquid discharge head 200 and a support member 71 to support the substrate as illustrated in FIG. 3F can be obtained by a manufacture method including the following processes. The liquid discharge head 200 includes a liquid discharge head substrate and the channel wall member 101, which is a member including a liquid discharge port. The support member 71 includes a path 72 to supply a discharged liquid to the liquid discharge head substrate. More specifically, the manufacturing method includes a process to prepare the liquid discharge head 200 and a process to connect the liquid discharge head substrate and the support member in such a way that the etching mask layer 13 is positioned between the support member and the substrate and the opening 30 of the etching mask layer and the path 72 are communicatively connected.

A first exemplary embodiment of the present invention will be described. A liquid discharge head is produced based on the process flow of liquid supply port, liquid channel, and liquid discharge port formation illustrated in FIGS. 1A to 1J. A liquid discharge head manufactured according to the first exemplary embodiment includes a liquid supply port containing a first portion and a plurality of second portions, a liquid channel communicatively connected to the liquid supply port, and a liquid discharge port communicatively connected to the liquid channel to discharge a liquid on the first plane. The first exemplary embodiment will be described in detail below. FIGS. 4A to 4E are perspective views of the process flow of FIGS. 1A to 1J and sectional views in FIGS. 1E to 1H correspond to FIGS. 4A to 4D and FIG. 1J corresponds to FIG. 4E. In FIGS. 4A to 4E, a positive type resist 14 and a protective layer 17 are not illustrated.

First, an etching mask layer having an opening in a shape corresponding to the plurality of second portions of the liquid supply port is formed on the second plane of the substrate and a liquid channel pattern is formed on the first plane using a removable resin layer. The soluble resin layer is not specifically limited if the compound can be removed by a solvent or the like in a post-process and the solvent used for removal and the method thereof are also not specifically limited. A photolithographic process can be used and thus, a positive type photosensitive resin is suitably used.

Figure 1A:
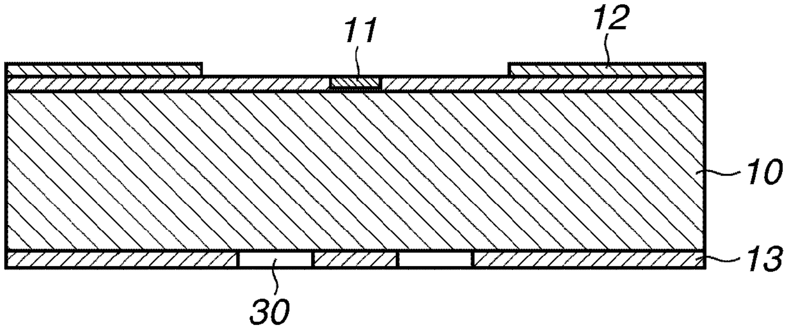
FIGS. 1A to 1J are schematic sectional views illustrating a first exemplary embodiment.

More specifically, as illustrated in FIG. 1A, the liquid discharge energy generation element 11 and an adherence improvement layer 12 are provided on the front (first plane) surface of a silicon substrate 10. HIMAL (trade name, manufactured by Hitachi Chemical Co., Ltd.) is used as the adherence improvement layer 12 and a pattern is formed by a photolithographic process. The etching mask layer 13 having the opening 30 formed by patterning is provided on the rear (second plane) surface of the substrate 10. The etching mask layer having the opening is formed by patterning HIMAL (manufactured by Hitachi Chemical Co., Ltd.), which is the same material layer as the adherence improvement layer, to yield the pattern of the independent supply port (second portion) later.

Figure 1B:
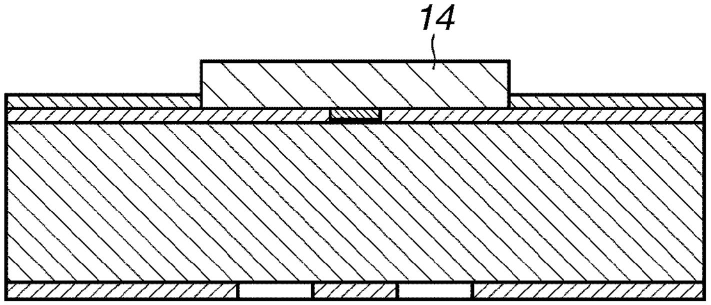

Next, as illustrated in FIG. 1B, the positive type resist 14 is formed on the substrate 10 as a soluble resin layer.

Figure 1C:
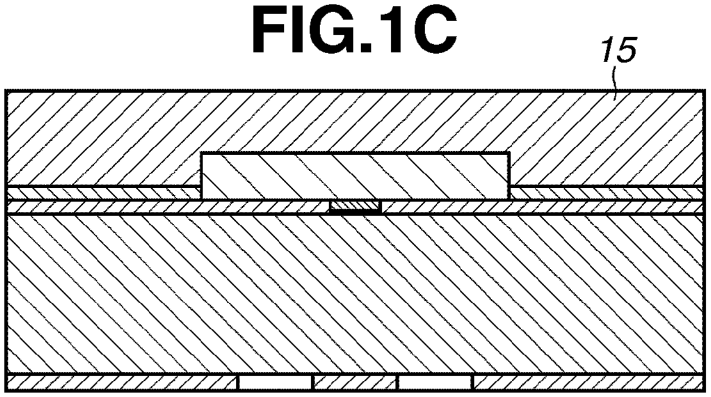

Next, a coating resin layer to be a wall of a liquid channel is formed on the soluble resin layer and a liquid discharge port pattern is formed by exposing to light and developing the coating resin layer. More specifically, as illustrated in FIG. 1C, the positive type resist 14 is coated with a liquid channel structure material 15 to form a coating resin layer. An inorganic material or an organic material may be used as the liquid channel structure material. It is suitable to use a negative type photosensitive resin in terms of being able to form a liquid discharge port by lithography and, among others, composition containing an epoxy resin and an optical cationic polymerization initiator is suitable in terms of sensitivity and mechanical strength of a cured substance.

Figure 1D:
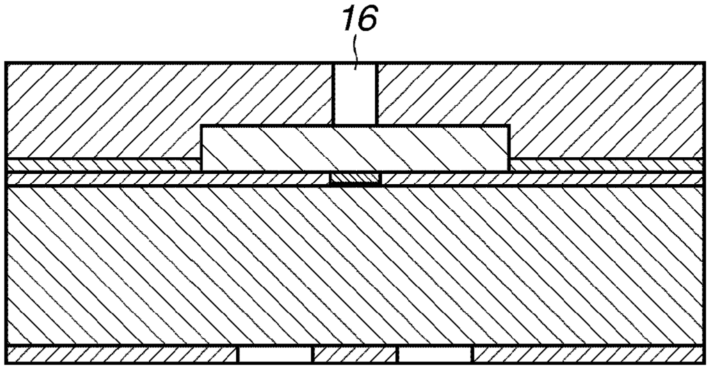

Further, as illustrated in FIG. 1D, the liquid channel structure material layer is exposed to light and developed to form a discharge port 16 serving as a liquid discharge port.

Figure 1E:
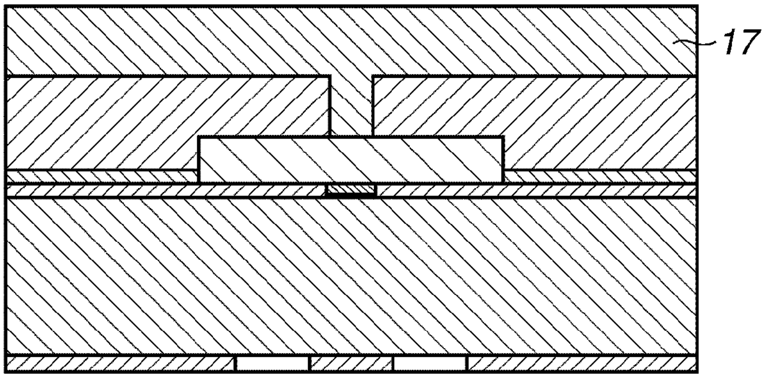
Figure 1F:
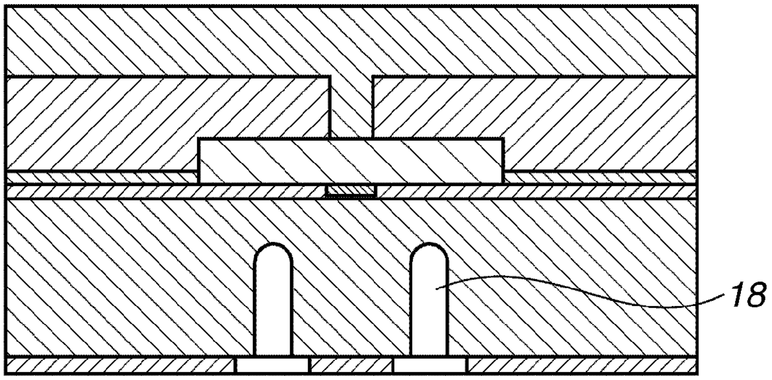

Next, a protective film to protect the inside of the liquid discharge port and the whole coating resin layer is coated. More specifically, as illustrated in FIG. 1E, the liquid channel structure material layer is coated with a liquid channel structure protective film 17 to protect the inside of the liquid discharge port and the whole material layer from an alkaline solution. Cycloisoprene is used as the protective film. As cycloisoprene, the material marketed under the name of OBC by TOKYO OHKA KOGYO Co., Ltd. is used. However, the protective film is not limited to cycloisoprene and any resin such as rubber base resin resistant to an alkaline solution can be applied as a protective film.

Then, the substrate is etched through the opening of the etching mask layer from the second plane side of the substrate to forma recess to be the first portion of the liquid supply port. More specifically, as illustrated in FIG. 1F, the non-through hole 18 is formed by laser processing technology inside the etching mask pattern formed in FIG. 1A from the second plane side. The depth of the non-through hole from the second plane is 200 μm.

Figure 1G:
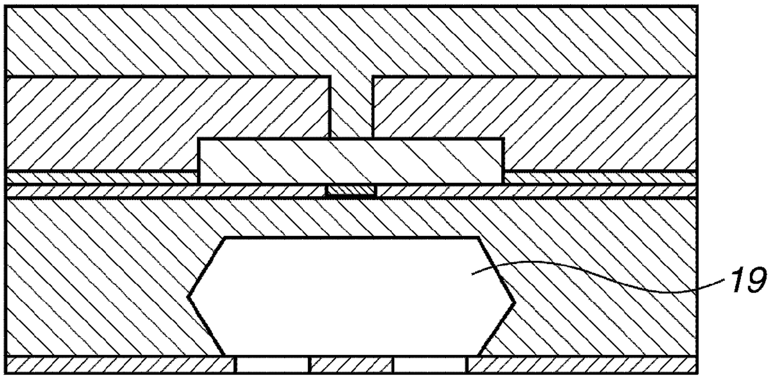

Then, the non-through hole 18 is soaked with tetramethylammonium hydride (TMAH) to form the common ink supply port 19 to supply ink to be the first portion (FIG. 1G). Thus, the common ink supply port 19 is formed by the method combining laser processing technology and wet etching.

Figure 1H:
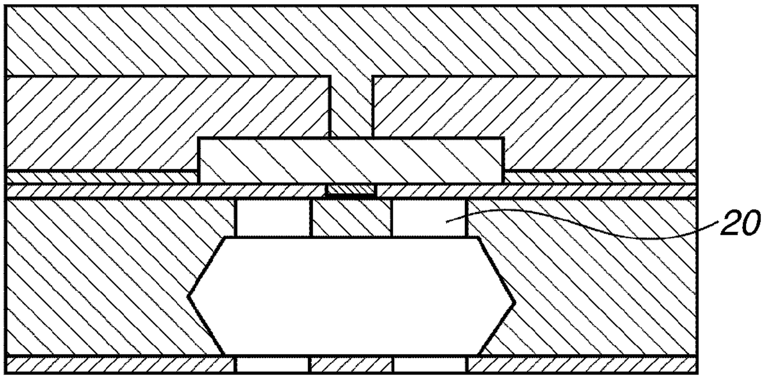

Next, the plurality of second portions is formed by etching a portion from the bottom of the first portion to the first plane using the same etching mask layer as a mask from the second plane side to form the liquid supply port passing through the substrate. The same etching mask layer refers to the etching mask layer used to form the first portion of the liquid supply port and the etching mask layer is used as it is to form the second portions. More specifically, as illustrated in FIG. 1H, gas cluster etching is performed using the etching mask layer 13 formed on the rear surface of the substrate to form the independent ink supply port 20. Conditions for gas cluster etching include the use of a mixed gas of chlorine trifluoride ($ClF_3$) and Ar, the gas flow rate of 500 sccm, the gas pressure of 10 Pa, and the etching time of 5 min. In the first exemplary embodiment, aluminum is used as the etching stop layer. The etching stop layer is not illustrated in drawings (FIGS. 1A to 1J and FIGS. 4A to 4E) of the first exemplary embodiment.

Figure 1I:
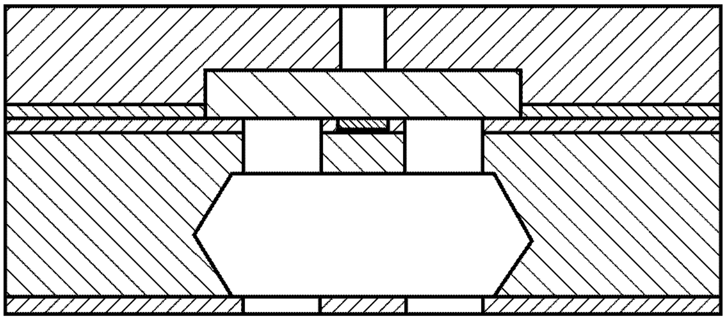
Figure 1J:
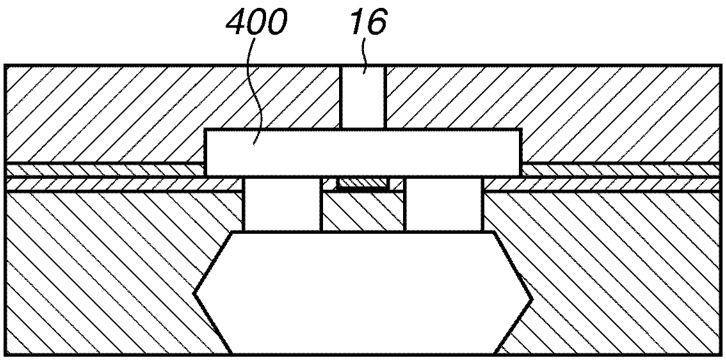

Next, as illustrated in FIG. 1I, the liquid channel structure protective film 17 (OBC) is removed from the silicon substrate using xylene. Lastly, the soluble resin layer is dissolved and removed, the etching mask layer is removed, and the coating resin layer is thermally cured. More specifically, as illustrated in FIG. 1J, the positive type resist 14 is removed, the etching mask layer 13 on the rear surface is removed, a liquid channel is formed, and the coating resin layer is thermally cured to obtain an ink jet recording head. As the method of removing the etching mask layer 13, the etching mask layer is made of positive resist and thus, a common resist peeling solution (1112A: trade name, manufactured by Rohm and Haas Electronic Material K.K.) is used to peel off the etching mask layer 13.

A second exemplary embodiment of the present invention will be described with reference to the process flow in FIGS. 2A to 2D.

Figure 2A:
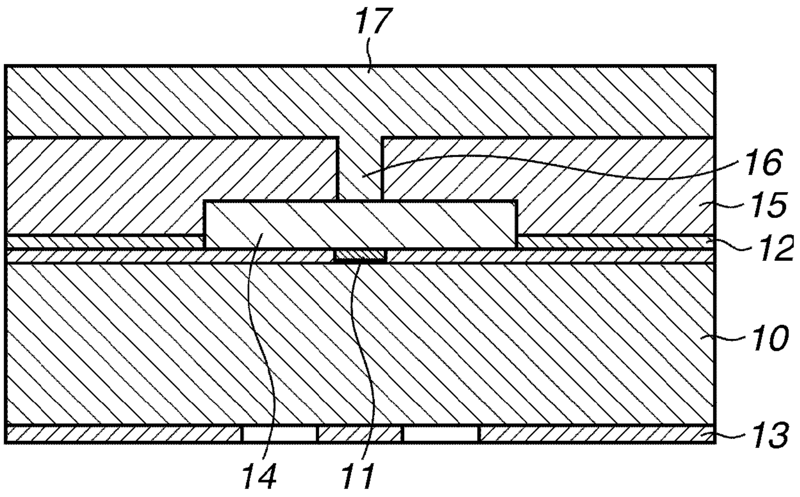
FIGS. 2A to 2D are schematic sectional views illustrating a second exemplary embodiment.
Figure 2B:
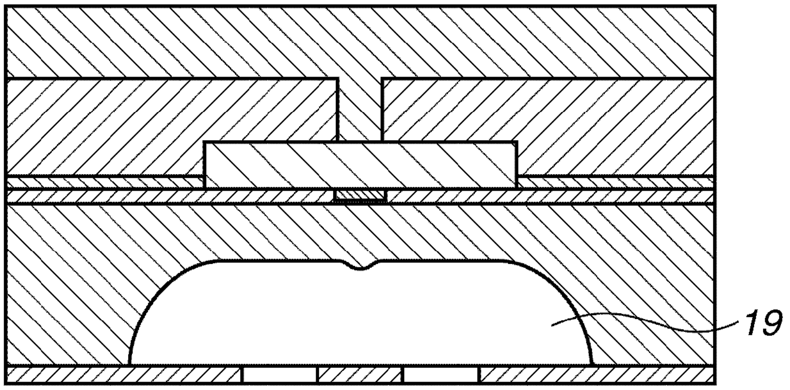

First, like in the first exemplary embodiment, a substrate illustrated in FIG. 2A (i.e., FIG. 1E) is produced. Subsequently, the second exemplary embodiment is changed from the first exemplary embodiment in the following respects when the common ink supply port 19 is formed as the first portion. More specifically, instead of performing anisotropic etching by TMAH after laser processing (FIG. 1F), isotropic dry etching using a xenon fluoride gas ($XeF_2$) is performed. The $XeF_2$ gas is a gas used to isotropically etch silicon and, as illustrated in FIG. 2B, etching proceeds isotropically from the etching mask opening.

Figure 2C:
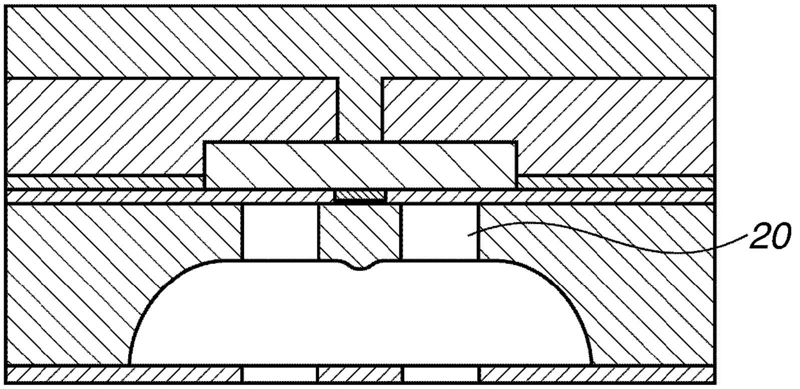

Then, as illustrated in FIG. 2C, gas cluster etching is performed under the same conditions as in the first exemplary embodiment using the etching mask layer 13 to form the independent supply port 20 serving as the second portion.

Then, like in the first exemplary embodiment, the liquid channel structure protective film 17 (OBC) is removed from the silicon substrate using xylene. Lastly, the positive resist 14 is removed, the etching mask layer 13 on the rear surface is removed, a liquid channel is formed, and the coating resin layer is thermally cured to obtain an ink jet recording head illustrated in FIG. 2D. For the removal of the etching mask layer 13, a resist peeling solution (1112A: trade name, manufactured by Rohm and Haas Electronic Material K.K.) is used.

The third exemplary embodiment of the present invention will be described with reference to the process flow in FIGS. 3A to 3E. FIG. 5 is a perspective view of an ink jet recording head manufactured according to the third exemplary embodiment.

Figure 2D:
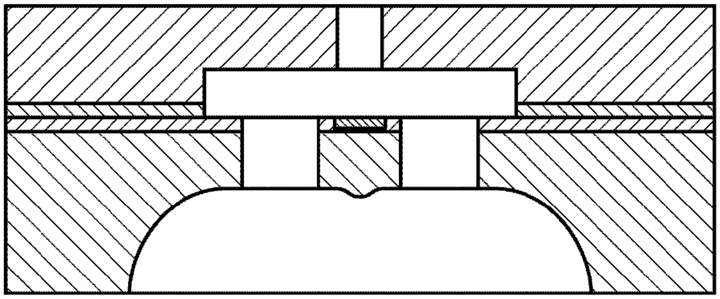

In the third exemplary embodiment, in contrast to the first and second exemplary embodiments, the etching mask layer 13 formed on the rear surface is not removed after the independent supply port is formed. Specifically, the etching mask layer in the stage of FIGS. 1J and 2D is left on the substrate, instead of being removed. Accordingly, the etching mask layer 13 can act as a filter to trap contaminants in the liquid. Otherwise, just like in the first exemplary embodiment, an ink jet recording head having the etching mask layer illustrated in FIG. 3E is obtained. Further, as illustrated in FIG. 3F, the head 200 is connected to the alumina support member 71 including the liquid path 72 to supply a liquid to the head 200 in such a way that the liquid path 72 is communicatively connected to the opening 30. By undergoing the above process, the ink jet recording head assembly 1000 is obtained.

According to the present invention, as described above, an etching mask pattern is formed on the opposite side on which a liquid channel pattern and a liquid discharge port pattern are formed and a common ink supply port and an independent ink supply port are formed using the same etching mask layer and therefore, the number of processes can be reduced.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-115350 filed May 19, 2010, which is hereby incorporated by reference herein in its entirety.

What is claimed is:

1. A method of manufacturing a liquid discharge head substrate, the liquid discharge head substrate including a silicon substrate having a first surface and a second surface opposite the first surface, a liquid supply port being formed in the silicon substrate, the liquid supply port having a first portion that is a recess having an opening in the second surface and having a bottom between the first surface and the second surface and a plurality of second portions that are through-holes passing through from the bottom of the first portion to the first surface, the manufacture method comprising:

forming an etching mask layer having an opening in a shape corresponding to the plurality of second portions at the second surface of the silicon substrate;

forming non-through holes to be the first portion by etching the silicon substrate through the opening of the etching mask layer from a second surface side of the silicon substrate, wherein the non-though holes are expanded in a direction parallel to the second surface by etching the silicon substrate between the non-through holes so that the none-through holes are connected to each other to form a recess to be the first portion; and forming the plurality of second portions by etching a portion from the bottom of the first portion to the first surface using the etching mask layer as a mask from the second surface side of the silicon substrate to form the liquid supply port passing through the silicon substrate.

2. The method of manufacturing a liquid discharge head substrate according to claim 1, further comprising removing the etching mask layer after the liquid supply port is formed.

3. The method of manufacturing a liquid discharge head substrate according to claim 1, wherein the second portions of the liquid supply port are formed by an Si processing method using a gas cluster.

4. The method of manufacturing a liquid discharge head substrate according to claim 1, wherein the second portions of the liquid supply port are formed by an Si processing method using reactive ion etching and a gas pressure is set to 0.1 Pa or more and 50 Pa or less for etching as a processing condition.

5. The method of manufacturing a liquid discharge head substrate according to claim 1, wherein the first portion of the liquid supply port is formed by a method selected from a group consisting of laser processing technology, anisotropic etching, and dry etching or a method combining two or more methods from the group.

6. The method of manufacturing a liquid discharge head substrate according to claim 1, wherein the etching mask layer is any of a non-photosensitive resin material layer, a photosensitive resin material layer, an inorganic film, and a metal film.

7. A method of manufacturing a liquid discharge head assembly, comprising:

preparing a liquid discharge head having a liquid discharge head substrate obtained by the manufacture method of a liquid discharge head substrate according to claim 1 and a member including a liquid discharge port to discharge a liquid; and connecting the liquid discharge head substrate and a support member in such a way that the etching mask layer is positioned between the support member having a path to supply a discharged liquid to the liquid discharge head substrate to support the substrate and the substrate, and the opening of the etching mask layer and the path are communicatively connected.

8. The method of manufacturing a liquid discharge head substrate according to claim 1, wherein plural through-holes are formed on the bottom of one first portion.

9. A method of manufacturing a liquid discharge head having a silicon substrate, the silicon substrate including a first surface and a second surface opposite the first surface and in which a liquid supply port is formed, the liquid supply port having a first portion that is a recess having an opening in the second surface and having a bottom between the first surface and the second surface and a plurality of second portions that are through-holes passing through from the bottom of the first portion to the first surface on the silicon substrate having the first surface, the manufacture method comprising:

forming a liquid channel pattern with a soluble resin layer on the first surface of the silicon substrate;

forming a coating resin layer on the soluble resin layer;

forming a liquid discharge port pattern by exposing the coating resin layer to light and developing the same;

coating a protective film to protect an inside of the liquid discharge port and the whole coating resin layer;

forming an etching mask layer having an opening in a shape corresponding to the plurality of second portions at the second surface of the silicon substrate;

forming a non-through holes to be the first portion by etching the silicon substrate through the opening of the etching mask layer from a second surface side of the silicon substrate, wherein the non-though holes are expanded in a direction parallel to the second surface by etching the silicon substrate between the non-through holes so that the none-through holes are connected to each other to form a recess to be the first portion;

forming the plurality of second portions by etching a portion from the bottom of the first portion to the first surface using the etching mask layer as a mask from the second surface side of the silicon substrate to form the liquid supply port passing through the silicon substrate;

dissolving and removing the soluble resin layer; and curing the coating resin layer thermally.

10. The method of manufacturing a liquid discharge head according to claim 9, further comprising removing the etching mask layer after the liquid supply port is formed.

11. The method of manufacturing a liquid discharge head according to claim 9, wherein the second portions of the liquid supply port are formed by an Si processing method using a gas cluster.

12. The method of manufacturing a liquid discharge head according to claim 9, wherein the second portions of the liquid supply port are formed by an Si processing method using reactive ion etching and a gas pressure is set to 0.1 Pa or more and 50 Pa or less for etching as a processing condition.

13. The method of manufacturing a liquid discharge head according to claim 9, wherein the first portion of the liquid supply port is formed by a method selected from a group consisting of laser processing technology, anisotropic etching, and dry etching or a method combining two or more methods from the group.

14. The method of manufacturing a liquid discharge head according to claim 9, wherein the etching mask layer is any of a non-photosensitive resin material layer, a photosensitive resin material layer, an inorganic film, and a metal film.

15. The method of manufacturing a liquid discharge head according to claim 9, wherein plural through-holes are formed on the bottom of one first portion.

* * * * *